(12) United States Patent
Hu et al.

(10) Patent No.: US 10,886,410 B2
(45) Date of Patent: Jan. 5, 2021

(54) THIN FILM TRANSISTOR, DISPLAY SUBSTRATE, METHOD FOR MANUFACTURING THE SAME, AND DISPLAY DEVICE

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Yingbin Hu, Beijing (CN); Ce Zhao, Beijing (CN); Yuankui Ding, Beijing (CN); Wei Li, Beijing (CN); Wei Song, Beijing (CN); Luke Ding, Beijing (CN); Jun Liu, Beijing (CN); Liangchen Yan, Beijing (CN)

(73) Assignees: HEFEI XINSHENG OPTOELECTRONICS TECHNOLOGY CO., LTD., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/393,023

(22) Filed: Apr. 24, 2019

(65) Prior Publication Data
US 2020/0035836 A1   Jan. 30, 2020

(30) Foreign Application Priority Data
Jul. 27, 2018   (CN) .......................... 2018 1 0846256

(51) Int. Cl.
*H01L 29/786* (2006.01)
*H01L 27/32* (2006.01)
*H01L 29/66* (2006.01)

(52) U.S. Cl.
CPC .... *H01L 29/78633* (2013.01); *H01L 27/3262* (2013.01); *H01L 27/3272* (2013.01); *H01L 29/66969* (2013.01); *H01L 29/7869* (2013.01)

(58) Field of Classification Search
CPC ............ H01L 27/3262; H01L 27/3272; H01L 29/66969; H01L 29/78633; H01L 29/7869; H01L 51/5281
(Continued)

(56) References Cited

U.S. PATENT DOCUMENTS

2014/0291635 A1\* 10/2014 Cho .................... H01L 29/7869 257/40
2019/0172954 A1\* 6/2019 Zhou ................... H01L 29/7869
(Continued)

*Primary Examiner* — Long K Tran
(74) *Attorney, Agent, or Firm* — Westman, Champlin & Koehler, P.A.

(57) ABSTRACT

Provided is a thin film transistor, including: a conductive light shielding layer; a metal oxide layer arranged on the light shielding layer; a buffer layer, an active layer, a gate insulating layer, a gate electrode, and an interlayer insulating layer arranged in sequence on the metal oxide layer, the interlayer insulating layer and the buffer layer comprising a first via hole and a second via hole for exposing the active layer, and a third via hole for exposing the metal oxide layer, in which a portion of the metal oxide layer exposed through the third via hole is a conductive portion, and other portions are insulative; and a source electrode and a drain electrode arranged on the interlayer insulating layer, in which the source electrode is connected to the active layer through the first via hole, and the drain electrode is connected to the active layer through the second via hole and connected to the conductive portion through the third via hole.

20 Claims, 4 Drawing Sheets

(58) Field of Classification Search
USPC .......................................................... 257/43
See application file for complete search history.

(56) References Cited

U.S. PATENT DOCUMENTS

2019/0207038 A1* 7/2019 Sun .................... H01L 29/78633
2019/0229172 A1* 7/2019 Liu ..................... H01L 27/3246

* cited by examiner

THIN FILM TRANSISTOR, DISPLAY SUBSTRATE, METHOD FOR MANUFACTURING THE SAME, AND DISPLAY DEVICE

CROSS-REFERENCE TO RELATED APPLICATION

This application claims a priority to Chinese Patent Application No. 201810846256.2 filed on Jul. 27, 2018, the disclosures of which are incorporated in their entirety by reference herein.

TECHNICAL FIELD

The present disclosure relates to the field of display technology, in particular to a thin film transistor, a display substrate, a method for manufacturing the same, and a display device.

BACKGROUND

Nowadays, organic electroluminescent diode (OLED) display products have become an inevitable trend in replacing liquid crystal display products, in which the development of display products of top gate structure is the key point of the future. In the OLED display product of the top gate structure, in order to avoid the influence of illumination on the active layer of the thin film transistor, a light shielding layer is arranged between the active layer of the thin film transistor and the substrate, and the light shielding layer is generally made of metal. In order to avoid parasitic capacitance between the light shielding layer and the electrode of the thin film transistor, it is necessary to perform a via hole etching on the insulating layer of the thin film transistor, so that the drain electrode of the thin film transistor is electrically connected to the light shielding layer through the via hole penetrating the insulating layer. When the via hole etching is performed on the insulating layer, it is difficult to control the etching time due to the large difference in the uniformity of the large-size thy etching. When the etching time is long, the light shielding layer is etched completely, resulting in a large bonding resistance. When the etching time is short, the insulating layer is not etched completely, resulting in a bonding disconnection. The above reasons lead to a low yield of the display substrate.

SUMMARY

An embodiment of the present disclosure provides a technical solution as follows:

In one aspect, a thin film transistor is provided, including:
a conductive light shielding layer;
a metal oxide layer arranged on the light shielding layer;
a buffer layer, an active layer, a gate insulating layer, a gate electrode, and an interlayer insulating layer arranged in sequence on the metal oxide layer, the interlayer insulating layer and the buffer layer including a first via hole and a second via hole for exposing the active layer, and a third via hole for exposing the metal oxide layer, in which a portion of the metal oxide layer exposed through the third via hole is a conductive portion, and other portions are insulative; and
a source electrode and a drain electrode arranged on the interlayer insulating layer, in which the source electrode is connected to the active layer through the first via hole, and the drain electrode is connected to the active layer through the second via hole and connected to the conductive portion through the third via hole.

Further, the first via hole passes through the interlayer insulating layer in a direction perpendicular to the light shielding layer and extends to the active layer, the second via hole passes through the interlayer insulating layer in a direction perpendicular to the light shielding layer and extends to the active layer, and the third via hole passes through the interlayer insulating layer and the buffer layer in a direction perpendicular to the light shielding layer in sequence and extends to the active layer.

Further, the metal oxide layer has a refractive index greater than refractive indexes of the buffer layer the gate insulating layer, and the interlayer insulating layer.

Further, the metal oxide layer is made of LaTiOx.

Further, the metal oxide layer has a thickness of 100 nm to 6000 nm.

An embodiment of the present disclosure further provides a method for manufacturing a thin film transistor, including:
forming a conductive light shielding layer;
forming a metal oxide layer on the light shielding layer;
forming a buffer layer, an active layer, a gate insulating layer, a gate electrode, and an interlayer insulating layer in sequence on the metal oxide layer;
forming a first via hole and a second via hole for exposing the active layer and a third via hole for exposing the metal oxide layer by dry-etching the interlayer insulating layer and the buffer layer;
treating the metal oxide layer through the third via hole, such that the metal oxide layer at the third via hole is converted into a conductive pattern; and
forming a source electrode and a drain electrode on the interlayer insulating layer, in which the source electrode is connected to the active layer through the first via hole, and the drain electrode is connected to the active layer through the second via hole and connected to the conductive pattern through the third via hole.

Further, the metal oxide layer has a refractive index greater than refractive indexes of the buffer layer the gate insulating layer, and the interlayer insulating layer.

Further, the metal oxide layer is made of LaTiOx.

Further, the metal oxide layer has a thickness of 100 nm to 6000 nm.

Further, the treating the metal oxide layer through the third via hole includes:
introducing oxygen into the third via hole to generate oxygen ions, bombarding LaTiOx in the third via hole, and adjusting an oxygen content of LaTiOx to convert LaTiOx at the third via hole into a conductor; or
introducing helium into the third via hole to generate helium ions, bombarding LaTiOx in the third via hole, and adjusting an oxygen content of LaTiOx to convert LaTiOx at the third via hole into a conductor.

An embodiment of the present disclosure also provides a method for manufacturing a display substrate on which a thin film transistor is manufactured using the manufacture method described above.

An embodiment of the present disclosure also provides a display substrate including the thin film transistor as described above.

An embodiment of the present disclosure further provides a display device including the display substrate as described above.

REFERENCE NUMBERS

Figure 1:
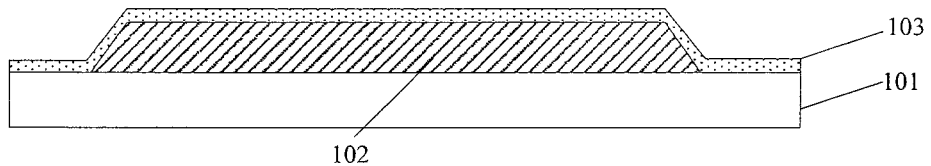
FIG. 1 to FIG. 9 are schematic diagrams showing the process of manufacturing a display substrate according to an embodiment of the present disclosure.

- 101 base substrate
- 102 light shielding layer
- 103 metal oxide layer
- 104 buffer layer
- 105 active layer
- 106 gate insulating layer
- 107 gate electrode
- 108 interlayer insulating layer
- 11 first via hole
- 12 second via hole
- 13 third via hole
- 111 conductive pattern
- 112 source electrode
- 113 drain electrode

DETAILED DESCRIPTION

In order to make the technical problems to be solved, the technical solutions, and the advantages of the examples of the present disclosure, the present disclosure will be described hereinafter in conjunction with the drawings and specific examples.

An embodiment of the present disclosure provides a thin film transistor, a display substrate, a method for manufacturing the same, and a display device, all of which may improve the yield of the display substrate.

An embodiment of the present disclosure provides a thin film transistor including:

a conductive light shielding layer;

a metal oxide layer arranged on the light shielding layer;

a buffer layer, an active layer, a gate insulating layer, a gate electrode, and an interlayer insulating layer arranged in sequence on the metal oxide layer, the interlayer insulating layer and the buffer layer including a first via hole and a second via hole for exposing the active layer, and a third via hole for exposing the metal oxide layer, in which a portion of the metal oxide layer exposed through the third via hole is a conductive portion, and other portions are insulative; and a source electrode and a drain electrode arranged on the interlayer insulating layer, in which the source electrode is connected to the active layer through the first via hole, and the drain electrode is connected to the active layer through the second via hole and connected to the conductive portion through the third via hole.

In the thin film transistor of this embodiment, a metal oxide layer is added to the light shielding layer. Since the metal oxide has a large atomic radius and is resistant to physical bombardment etching, when the interlayer insulating layer and the buffer layer are dry etched, they can be fully over etched to remove all buffer layers at the third via hole, thereby avoiding the existence of buffer layer residue at the third via hole, and the metal oxide layer will not be over etched, thereby overcoming the problem that the uniformity of dry etching is poor. The portion of the metal oxide layer corresponding to the third via hole is a conductive portion, so that the drain electrode can be connected to the conductive portion through the third via hole, and then electrically connected to the light shielding layer. In this design, there is no problem that the drain electrode and the light shielding layer are poorly bonded at the via hole, and thus the yield of the display substrate can be improved.

Further, the metal oxide layer has a refractive index greater than refractive indexes of the buffer layer the gate insulating layer, and the interlayer insulating layer. Specifically, the refractive index of the metal oxide layer may be greater than 1.9. In the pixel region, due to a certain distance between the light emitting layer and the base substrate, the light emitted by the light emitting layer of the pixel region is obliquely incident and scattered into the adjacent pixel regions, causing a risk of color mixing between adjacent pixels. If the metal oxide layer is a high refractive index material having a refractive index of 1.9 or more, when the light emitted from the light emitting layer of the pixel region is obliquely incident or scattered into the metal oxide layer, light shrinkage occurs, thereby relieving the problem of color mixing between pixels to some extent.

Specifically, the metal oxide layer may be made of LaTiOx. LaTiOx is a high refractive index transparent material having a refractive index of 1.9 or more and having an large atomic radius, and thus it is difficult to perform physical bombardment etching. The conductive property of LaTiOx material is affected by the value of x, such that it can be converted between the conductor and the insulator. When LaTiOx layer is coated on the light shielding layer, the value of x is adjusted to ensure that LaTiOx layer is an insulator. When LaTiOx material in the third via hole is processed, the value of x is adjusted to ensure that the corresponding portion of LaTiOx is converted into a conductor.

An embodiment of the present disclosure provides a method for manufacturing a thin film transistor, including:

forming a conductive light shielding layer;

forming a metal oxide layer on the light shielding layer;

forming a buffer layer, an active layer, a gate insulating layer, a gate electrode, and an interlayer insulating layer in sequence on the metal oxide layer;

forming a first via hole and a second via hole for exposing the active layer and a third via hole for exposing the metal oxide layer by dry-etching the interlayer insulating layer and the buffer layer;

treating the metal oxide layer through the third via hole, such that the metal oxide layer at the third via hole is converted into a conductive pattern; and forming a source electrode and a drain electrode on the interlayer insulating layer, in which the source electrode is connected to the active layer through the first via hole, and the drain electrode is connected to the active layer through the second via hole and connected to the conductive pattern through the third via hole.

In this embodiment, a metal oxide layer is added on the light shielding layer. Since the metal oxide has a large atomic radius and is resistant to physical bombardment etching, when the interlayer insulating layer and the buffer layer are dry etched, they can be fully over etched to remove all buffer layers at the third via hole, thereby avoiding the existence of buffer layer residue at the third via hole, and the metal oxide layer will not be over etched, thereby overcoming the problem that the uniformity of dry etching is poor. Then, the exposed metal oxide layer is treated through the third via hole, so that the metal oxide layer at the third via hole is converted into a conductive pattern, and thus the drain electrode can be connected to the conductive pattern through the third via hole, and then electrically connected to the light shielding layer. In this design, there is no problem that the drain electrode and the light shielding layer are poorly bonded at the via hole, and thus the yield of the display substrate can be improved.

Specifically, the light shielding layer may be made of a metal such as Al and Mg. The light shielding layer can effectively block external light from being irradiated to the active layer of the thin film transistor, thereby preventing external light from affecting the performance of the thin film transistor.

Further, the metal oxide layer has a refractive index greater than refractive indexes of the buffer layer the gate insulating layer, and the interlayer insulating layer.

The metal oxide layer is preferably made of a transparent insulating material having a refractive index of more than 1.9. When the thin film transistor is applied to the OLED display substrate, in the pixel region, due to a certain distance between the light emitting layer and the base substrate, the light emitted by the light emitting layer of the pixel region is obliquely incident and scattered into the adjacent pixel regions, causing a risk of color mixing between adjacent pixels. If the metal oxide layer is a high refractive index material having a refractive index of 1.9 or more, when the light emitted from the light emitting layer of the pixel region is obliquely incident or scattered into the metal oxide layer, light shrinkage occurs, thereby relieving the problem of color mixing between pixels to some extent.

Specifically, the metal oxide layer may be made of LaTiOx. LaTiOx is a high refractive index transparent material having a refractive index of 1.9 or more and having an large atomic radius, and thus it is difficult to perform physical bombardment etching. The conductive property of LaTiOx material is affected by the value of x, such that it can be converted between the conductor and the insulator. When LaTiOx layer is coated on the light shielding layer, the value of x is adjusted to ensure that LaTiOx layer is an insulator. When LaTiOx material in the third via hole is processed, the value of x is adjusted to ensure that the corresponding portion of LaTiOx is converted into a conductor.

Specifically, the metal oxide layer may have a thickness of 100 nm to 6000 nm.

Further, the treating the metal oxide layer through the third via hole includes:

introducing oxygen into the third via hole to generate oxygen ions, bombarding LaTiOx in the third via hole, and adjusting an oxygen content of LaTiOx to convert LaTiOx at the third via hole into a conductor; or introducing helium into the third via hole to generate helium ions, bombarding LaTiOx in the third via hole, and adjusting an oxygen content of LaTiOx to convert LaTiOx at the third via hole into a conductor.

The method for manufacturing the thin film transistor of the present disclosure will be further described in conjunction with the accompanying drawings and specific embodiments. The method for manufacturing the thin film transistor of the present embodiment includes:

1. Forming a Light Shielding Layer 102 and a Metal Oxide Layer 103 in Sequence on the Base Substrate 101

As shown in FIG. 1, a light shielding layer 102 and a metal oxide layer 103 are in sequence formed on a base substrate 101, in which the base substrate 101 may be a glass substrate or a quartz substrate. Specifically, a light shielding layer material is deposited on the base substrate 101, in which the light shielding layer material may be a metal such as Cu, Al, Ag, Mo, Cr, Nd, Ni, Mn, Ti, Ta, W, and Mg, and an alloy of these metals, the light shielding layer material is patterned to form a light shielding layer 102.

The metal oxide layer 103 is coated on the light shielding layer 102. Specifically, the metal oxide layer 103 may be made of LaTiOx, and the metal oxide layer 103 may be formed by magnetron sputtering or electron beam thermal evaporation. The thickness ranges from 100 nm to 6000 nm.

2. Forming a Buffer Layer 104

Figure 2:
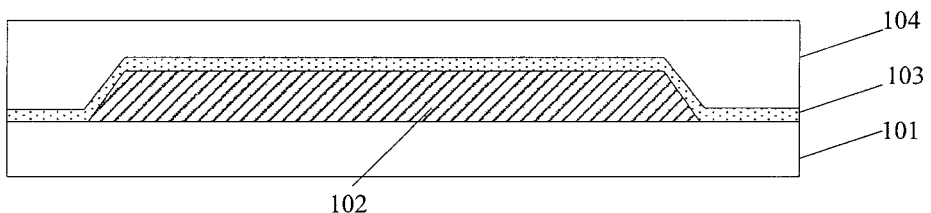

As shown in FIG. 2, by a plasma enhanced chemical vapor deposition (PECVD) method, a buffer layer 104 may be formed on the metal oxide layer 103 formed above, in which the material of the buffer layer 104 may be an oxide, a nitride or an oxynitride, such as a SiOx, or a stack of SiNx and SiOx, or a stack of SiNx, SiNOx and SiOx, and the thickness of the buffer layer 104 ranges from 100 nm to 6000 nm.

3. Forming an Active Layer 105

Figure 3:
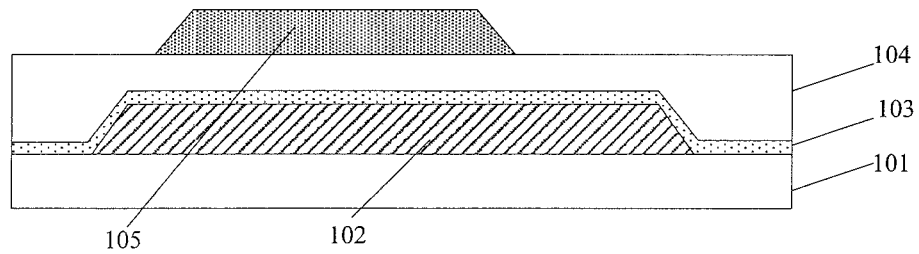

As shown in FIG. 3, a semiconductor material may be deposited on the buffer layer 104 formed above, and the semiconductor material is patterned to form the active layer 105.

4. Forming a Gate Insulating Layer 106

Figure 4:
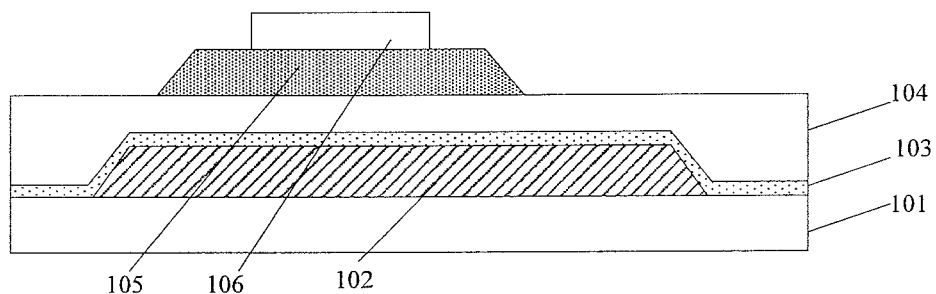

As shown in FIG. 4, a gate insulating layer 106 having a thickness of 500 Å to 5,000 Å may be deposited on the active layer 105 formed above by a plasma enhanced chemical vapor deposition method. The material of the gate insulating layer 106 may be an oxide, a nitride. or an oxynitride, and the reaction gas is $SiH_4$, $NH_3$, $N_2$ or $SiH_2Cl_2$, $NH_3$, $N_2$.

5. Forming a Gate Electrode 107 of the Thin Film Transistor

Figure 5:
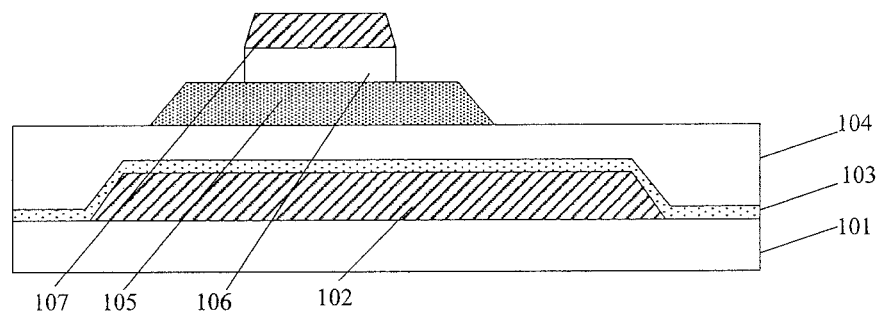

As shown in FIG. 5, a gate metal layer having a thickness of about 500 Å to 4,000 Å may be deposited on the gate insulating layer 106 formed above by sputtering or thermal evaporation. The material of the gate metal layer may be a metal such as Cu, Al, Ag, Mo, Cr, Nd, Ni, Mn, Ti, Ta, W, and an alloys of these metals. The gate metal layer may be a single layer structure or a multilayer structure, such as Cu\Mo, Ti\Cu\Ti, and Mo\Al\Mo. The gate metal layer is patterned to form a pattern of the gate electrode 107.

6. Forming an Interlayer Insulating Layer 108

Figure 6:
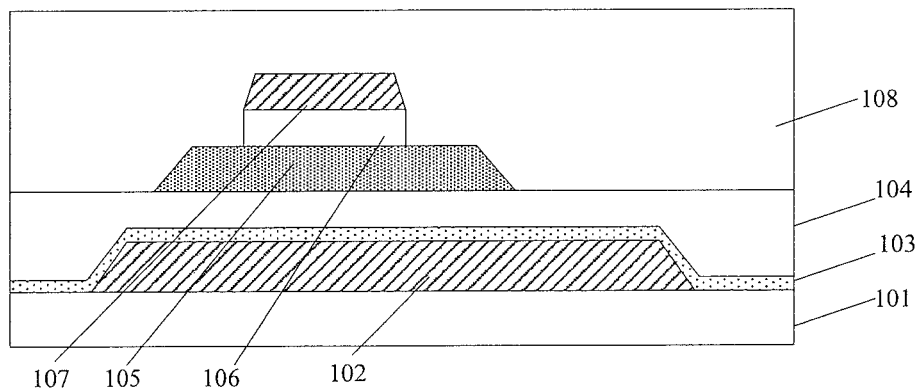

As shown in FIG. 6, by a plasma enhanced chemical vapor deposition method, an interlayer insulating layer 108 is formed on the base substrate 101 in which the light shielding layer 102, the metal oxide layer 103, the buffer layer 104, the active layer 105, the gate insulating layer 106, and the gate electrode 107 are formed. The material of the interlayer insulating layer 108 may be an oxide, a nitride or an oxynitride.

7. Patterning the Interlayer Insulating Layer 108 and the Buffer Layer 104 to Form a First Via Hole 11 and a Second Via Hole 12 Both Exposing the Active Layer 105, as Well as a Portion of the Third Via Hole 13

Figure 7:
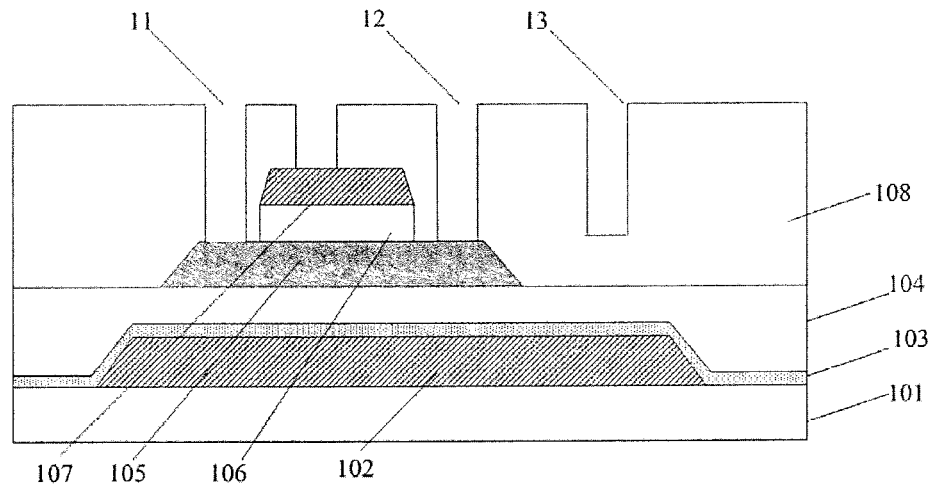

As shown in FIG. 7, only the interlayer insulating layer 108 may be etched to form the first via hole 11, the second via hole 12, and a portion of the third via hole 13.

8. Forming a Third Via Hole 13 and Treating the Metal Oxide Layer 103 in the Third Via Hole 13

Figure 8:
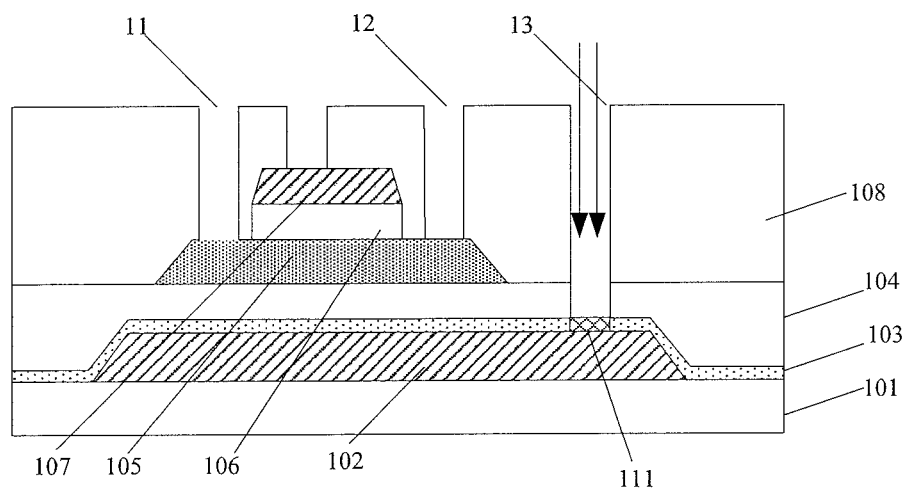

As shown in FIG. 8, after the first via hole 11 and the second via hole 12 are formed, the remaining interlayer insulating layer 108 and the buffer layer 104 are also dry-etched at a portion of the formed third via hole 13, to form a third via hole 13 exposing the metal oxide layer 103. When the buffer layer 104 is etched, it can be over etched, so that the buffer layer 104 above the metal oxide layer 103 can be etched completely, thereby avoiding the problem of bonding disconnection. Since LaTiOx has a large atomic radius and is resistant to physical bombardment etching, when the buffer layer 104 is etched, even if the buffer layer 104 is sufficiently over etched, the LaTiOx will not be over etched, thereby reducing the influence that the uniformity of dry etching is poor.

Then, the metal oxide layer 103 in the third via hole 13 is treated, so that the metal oxide layer 103 at that portion is converted into the conductive pattern 111. Specifically, oxygen gas can be introduced to generate oxygen ions, and LaTiOx in the third via hole 13 is bombarded with oxygen, and the oxygen content of LaTiOx is adjusted. Optionally, helium gas can be introduced to generate helium ions, and LaTiOx in the third via hole 13 is bombarded, and the oxygen content of LaTiOx is adjusted. The conductivity of LaTiOx material is affected by the value of x, and the change of the conductor and the insulator occurs. When LaTiOx layer is coated, the value of x is adjusted to ensure that LaTiOx layer is an insulator; and when LaTiOx material in the third via hole 13 is treated, the value of x is adjusted to ensure that LaTiOx in the third via hole 13 is converted into a conductor.

Figure 9:
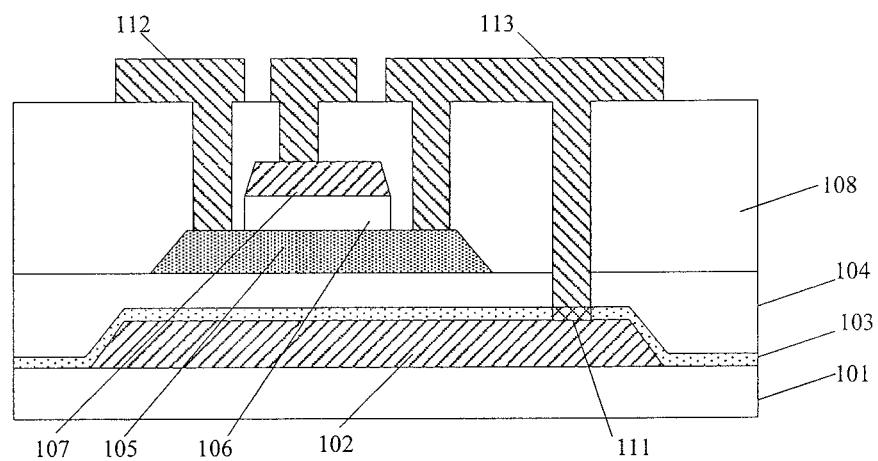

9. Forming a Source Electrode 112 and a Drain Electrode 113 of the Thin Film Transistor As shown in FIG. 9, by magnetron sputtering, then thermal evaporation or other film formation methods, a source/drain metal layer having a thickness of approximately 2000 Å to 4000 Å may be deposited on the base substrate 101, in which the first via hole, the second via hole, and the third via hole are formed. The material of the source/drain metal layer may be a metal such as Cu, Al, Ag, Mo, Cr, Nd, Ni, Mn, Ti, Ta, and W, and an alloy of these metals. The source/drain metal layer may be a single layer structure or a multilayer structure, such as Cu\Mo, Ti\Cu\Ti, and Mo\Al\Mo. The source/drain metal layer is patterned to form a source electrode 112 and a drain electrode 113. The source electrode 112 is connected to the active layer 105 through the first via hole 11, and the drain electrode 113 is connected to the active layer 105 through the second via hole 12 and connected to the conductive pattern 111 through the third via hole 13, to achieve an electrical connection with the light shielding layer 102. At the third via hole 13, the connection state of the drain electrode 113 and the conductive pattern 111 is good, and there is no problem of poor bonding.

Figure 10:
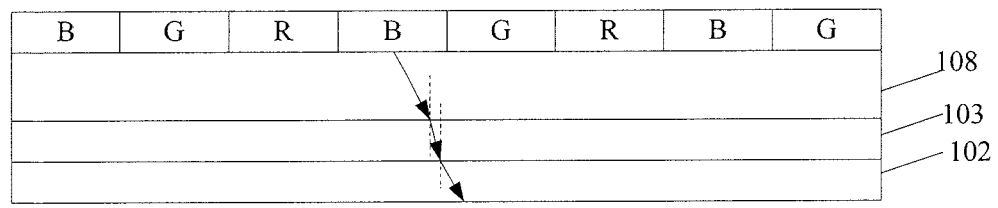
FIG. 10 is a schematic diagram showing the light refraction of a display substrate according to an embodiment of the present disclosure.

When the thin film transistor is applied to the OLED display substrate, in the pixel region, due to a certain distance between the light emitting layer and the base substrate, the light emitted by the light emitting layer of the pixel region is obliquely incident and scattered into the adjacent pixel regions, causing a risk of color mixing between adjacent pixels. In the present embodiment, the metal oxide layer is made of a high refractive index material LaTiOx having a refractive index of 1.9 or more. As shown in FIG. 10, when the light emitted from the light emitting layer of the pixel region is obliquely incident or scattered into the metal oxide layer 103 (R represents a red luminescent layer, G represents a green luminescent layer, and B represents a blue luminescent layer), light shrinkage occurs, thereby relieving the problem of color mixing between pixels due to oblique incidence or scattering to some extent.

An embodiment of the present disclosure also provides a method for manufacturing a display substrate, wherein a thin film transistor is manufactured using the method described above.

In this embodiment, a metal oxide layer is added on the light shielding layer. Since the metal oxide has a large atomic radius and is resistant to physical bombardment etching, when the interlayer insulating layer and the buffer layer are dry etched, they can be fully over etched to remove all buffer layers at the third via hole, thereby avoiding the existence of buffer layer residue at the third via hole, and the metal oxide layer will not be over etched, thereby overcoming the problem that the uniformity of dry etching is poor. Then, the exposed metal oxide layer is treated through the third via hole, so that the metal oxide layer at the third via hole is converted into a conductive pattern, and thus the drain electrode can be connected to the conductive pattern through the third via hole, and then electrically connected to the light shielding layer. In this design, there is no problem that the drain electrode and the light shielding layer are poorly bonded at the via hole, and thus the yield of the display substrate can be improved.

An embodiment of the present disclosure also provides a display substrate including the thin film transistor as described above. Specifically, the display substrate may be an OLED display substrate.

An embodiment of the present disclosure further provides a display device including the display substrate as described above. The display device may be any product or component having a display function, such as a television, a display, a digital photo frame, a mobile phone, a tablet computer, etc., in which the display device further includes a flexible circuit board, a printed circuit board, and a backplane.

In the method embodiments of the present disclosure, the serial numbers of the operations cannot be used to define the sequence of the operations. As for one skilled in the art, the changes in the order of operations without paying creative work also fall within the scope of the present disclosure.

Unless otherwise defined, technical terms or scientific terms used herein have the normal meaning commonly understood by one skilled in the art in the field of the present disclosure. The words "first", "second", and the like used in the present disclosure does not denote any order, quantity, or importance, but rather merely serves to distinguish different components. Similarly, the words "one", "a/an" and the like do not denote any quantitative limitation, but rather denote at least one. The "including", "comprising", and the like used in the present disclosure means that the element or item appeared in front of the word encompasses the element or item and their equivalents listed after the word, and does exclude other elements or items. The word "connected" or "connecting" and the like are not limited to physical or mechanical connections, but may include electrical connections, whether direct or indirect. "On", "under", "left", "right" and the like are only used to represent relative positional relationships, and when the absolute position of the described object is changed, the relative positional relationship may also be changed, accordingly.

It will be understood that when an element, such as a layer, film, region, or substrate, is referred to as being "on" or "under" another element, the element may be directly "on" or "under" another element, or there may be an intermediate element.

The above descriptions are preferred embodiments of the present disclosure. It should be noted that one skilled in the art would make several improvements and substitutions without departing from the principles of the present disclosure. These improvements and modifications should also be regarded as the protection scope of the present disclosure.

What is claimed is:

1. A thin film transistor, comprising:
   a conductive light shielding layer;
   a metal oxide layer arranged on the light shielding layer;
   a buffer layer, an active layer, a gate insulating layer, a gate electrode, and an interlayer insulating layer arranged in sequence on the metal oxide layer, the interlayer insulating layer comprising a first via hole and a second via hole for exposing the active layer, and the interlayer insulating layer and the buffer layer comprising a third via hole for exposing the metal oxide layer, wherein a portion of the metal oxide layer exposed through the third via hole is a conductive portion, and other portions are insulative; and a source electrode and a drain electrode arranged on the interlayer insulating layer, wherein the source electrode is connected to the active layer through the first via hole, and the drain electrode is connected to the active layer through the second via hole and connected to the conductive portion through the third via hole.

2. The thin film transistor of claim 1, wherein the first via hole passes through the interlayer insulating layer in a direction perpendicular to the light shielding layer and extends to the active layer, the second via hole passes through the interlayer insulating layer in a direction perpendicular to the light shielding layer and extends to the active layer, and the third via hole passes through the interlayer insulating layer and the buffer layer in a direction perpendicular to the light shielding layer in sequence and extends to the active layer.

3. The thin film transistor of claim 1, wherein the metal oxide layer has a refractive index greater than refractive indexes of the buffer layer the gate insulating layer, and the interlayer insulating layer.

4. The thin film transistor of claim 1, wherein the metal oxide layer is made of LaTiOx.

5. The thin film transistor of claim 1, wherein the metal oxide layer has a thickness of 100 nm to 6000 nm.

6. A method for manufacturing a thin film transistor of claim 1, comprising:
    forming a conductive light shielding layer;
    forming a metal oxide layer on the light shielding layer;
    forming a buffer layer, an active layer, a gate insulating layer, a gate electrode, and an interlayer insulating layer in sequence on the metal oxide layer;
    forming a first via hole and a second via hole for exposing the active layer and a third via hole for exposing the metal oxide layer by dry-etching the interlayer insulating layer and the buffer layer;
    treating the metal oxide layer through the third via hole, such that the metal oxide layer at the third via hole is converted into a conductive pattern; and
    forming a source electrode and a drain electrode on the interlayer insulating layer, wherein the source electrode is connected to the active layer through the first via hole, and the drain electrode is connected to the active layer through the second via hole and connected to the conductive pattern through the third via hole.

7. The method of claim 6, wherein the metal oxide layer has a refractive index greater than refractive indexes of the buffer layer the gate insulating layer, and the interlayer insulating layer.

8. The method of claim 6, wherein the metal oxide layer is made of LaTiOx.

9. The method of claim 6, wherein the metal oxide layer has a thickness of 100 nm to 6000 nm.

10. The method of claim 8, wherein the treating the metal oxide layer through the third via hole comprises:
    introducing oxygen into the third via hole to generate oxygen ions, bombarding LaTiOx in the third via hole, and adjusting an oxygen content of LaTiOx to convert LaTiOx at the third via hole into a conductor; or
    introducing helium into the third via hole to generate helium ions, bombarding LaTiOx in the third via hole, and adjusting an oxygen content of LaTiOx to convert LaTiOx at the third via hole into a conductor.

11. A method for manufacturing a display substrate, comprising manufacturing a thin film transistor on a substrate by the method of claim 6.

12. The method of claim 11, wherein the metal oxide layer has a refractive index greater than refractive indexes of the buffer layer the gate insulating layer, and the interlayer insulating layer.

13. The method of claim 11, wherein the metal oxide layer is made of LaTiOx, and the metal oxide layer has a thickness of 100 nm to 6000 nm.

14. The method of claim 13, wherein the treating the metal oxide layer through the third via hole comprises:
    introducing oxygen into the third via hole to generate oxygen ions, bombarding LaTiOx in the third via hole, and adjusting an oxygen content of LaTiOx to convert LaTiOx at the third via hole into a conductor; or
    introducing helium into the third via hole to generate helium ions, bombarding LaTiOx in the third via hole, and adjusting an oxygen content of LaTiOx to convert LaTiOx at the third via hole into a conductor.

15. A display substrate, comprising the thin film transistor of claim 1.

16. The display substrate of claim 15, wherein the first via hole passes through the interlayer insulating layer in a direction perpendicular to the light shielding layer and extends to the active layer, the second via hole passes through the interlayer insulating layer in a direction perpendicular to the light shielding layer and extends to the active layer, and the third via hole passes through the interlayer insulating layer and the buffer layer in a direction perpendicular to the light shielding layer in sequence and extends to the active layer.

17. The display substrate of claim 15, wherein the metal oxide layer has a refractive index greater than refractive indexes of the buffer layer the gate insulating layer, and the interlayer insulating layer.

18. The display substrate of claim 15, wherein the metal oxide layer is made of LaTiOx.

19. The display substrate of claim 15, wherein the metal oxide layer has a thickness of 100 nm to 6000 nm.

20. A display device, comprising the display substrate of claim 15.

* * * * *